United States Patent
Yang et al.

(10) Patent No.: US 10,564,262 B2
(45) Date of Patent: Feb. 18, 2020

(54) OPTICAL RANGING SYSTEM HAVING MULTI-MODE LIGHT EMITTER

(71) Applicant: AMS SENSORS SINGAPORE PTE. LTD., Singapore (SG)

(72) Inventors: Liu Yang, Shanghai (CN); Hartmut Rudmann, Jona (CH)

(73) Assignee: AMS SENSORS SINGAPORE PTE. LTD., Singapore (SG)

(*) Notice: Subject to any disclaimer, the term of this patent is extended or adjusted under 35 U.S.C. 154(b) by 527 days.

(21) Appl. No.: 15/334,587

(22) Filed: Oct. 26, 2016

(65) Prior Publication Data
US 2017/0115379 A1  Apr. 27, 2017

Related U.S. Application Data

(60) Provisional application No. 62/246,871, filed on Oct. 27, 2015.

(51) Int. Cl.
| | | |
|---|---|---|
| G01C 3/08 | (2006.01) |
| G01S 7/481 | (2006.01) |
| H01S 5/40 | (2006.01) |
| H01S 5/00 | (2006.01) |
| G01S 17/08 | (2006.01) |

(52) U.S. Cl.
CPC .......... *G01S 7/4815* (2013.01); *G01S 17/08* (2013.01); *H01S 5/005* (2013.01); *H01S 5/4025* (2013.01)

(58) Field of Classification Search
CPC ...... G01S 7/4815; G01S 17/08; H01S 5/4025; H01S 5/005
USPC .......................................... 356/4.03
See application file for complete search history.

(56) References Cited

U.S. PATENT DOCUMENTS

| | | | |
|---|---|---|---|
| 8,072,581 B1 * | 12/2011 | Breiholz | G01S 7/51 356/4.01 |
| 9,285,265 B2 | 3/2016 | Geiger et al. | |
| 9,832,357 B2 * | 11/2017 | Wan | H04N 5/23219 |
| 2009/0059201 A1 * | 3/2009 | Willner | G01S 7/491 356/5.01 |
| 2016/0216370 A1 * | 7/2016 | Shimon | G01S 7/4811 |
| 2019/0018137 A1 * | 1/2019 | Akkaya | G06T 7/521 |

FOREIGN PATENT DOCUMENTS

| | | |
|---|---|---|
| WO | 2015/130226 | 9/2015 |
| WO | 2016/010481 | 1/2016 |
| WO | 2016/148645 | 9/2016 |

\* cited by examiner

*Primary Examiner* — Mark Hellner

(57) ABSTRACT

An optical ranging system includes a demodulation pixel array and a multi-mode light emitter. The multi-mode light emitter includes an illumination source and can generate a diffuse illumination and a discrete illumination in a first and second mode, respectively. Accordingly, in some implementations, the optical ranging system collects distance data via a time-of-flight technique and a structure-light technique. The illumination source can be operable to produce a diffuse illumination in a first mode and a discrete illumination in a second mode.

15 Claims, 2 Drawing Sheets

OPTICAL RANGING SYSTEM HAVING MULTI-MODE LIGHT EMITTER

CROSS-REFERENCE TO RELATED APPLICATION(S)

Figure 1:
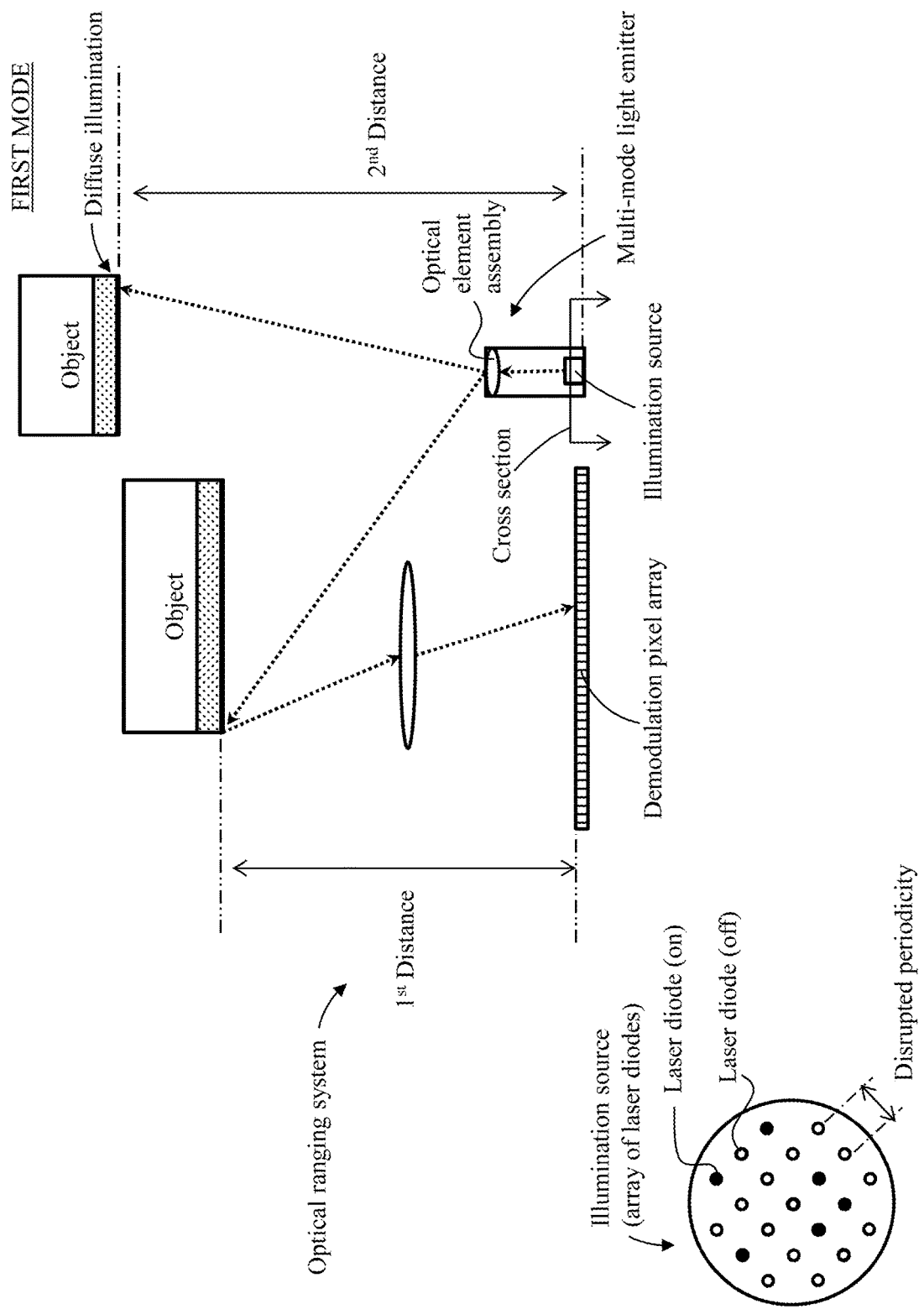

This application claims the benefit of priority of U.S. patent application Ser. No. 62/246,871, filed on Oct. 27, 2016, the contents of which are incorporated herein by reference in their entirety.

TECHNICAL FIELD

This disclosure relates to optical ranging systems.

BACKGROUND

A challenge exists to use less power in optical ranging systems. Optical ranging systems can include electronic devices operable to collect distance data, for example, time-of-flight cameras. Such systems typically include a light emitter and a pixel array configured to collect distance data. Such systems often further include optical elements associated with the light emitter and pixel array.

SUMMARY

The present disclosure describes an optical ranging system including a multi-mode light emitter and a demodulation pixel array. For example, in one aspect, an optical ranging system operable to collect distance data includes a demodulation pixel array and a multi-mode light emitter. The multi-mode light emitter includes an illumination source and is operable to generate a diffuse illumination in a first mode and a discrete illumination in a second mode.

In another aspect, an optical ranging system is operable to collect distance data within a first distance range using a first mode, and is further operable to collect distance data within a second distance range using a second mode. In another example aspect, an illumination source includes a laser diode. In yet another example aspect, an illumination source includes an array of laser diodes. In another example aspect, a multi-mode light emitter includes an optical element assembly. In another example aspect, an optical element assembly is operable to produce a diffuse illumination corresponding to a first mode and a discrete illumination corresponding to a second mode. In still another example aspect, an array of laser diodes is operable to produce a diffuse illumination corresponding to a first mode and a discrete illumination corresponding to a second mode. In still yet another example aspect, a power consumption of a first mode and a second mode is substantially similar (i.e., the same). In another example aspect an optical element assembly includes a tunable optical element.

In still another aspect, distance data is collected by a time-of-flight technique in a first mode, and distance data is collected by a structured-light technique in a second mode. In another example aspect, an optical element assembly comprises an actuatable optical element operable to generate a diffuse illumination in a first mode and a discrete illumination in a second mode. In another aspect, laser diodes within an array of laser diodes have a periodic arrangement. In another example aspect, an array of laser diodes having a periodic arrangement are operable to produce a discrete illumination in a second mode, and the array of laser diodes having the periodic arrangement are further operable to disrupt the periodic arrangement in order to produce a diffuse illumination in a first mode.

In still yet another aspect, an optical surface profile of a tunable optical element is altered by the application of electrical power. In another example aspect, a refractive index of a tunable optical element is altered by the application of electrical power.

Other aspects, features and advantages will be readily apparent from the following detailed description, the accompanying drawings, and the appended claims.

DESCRIPTION

Figure 2:
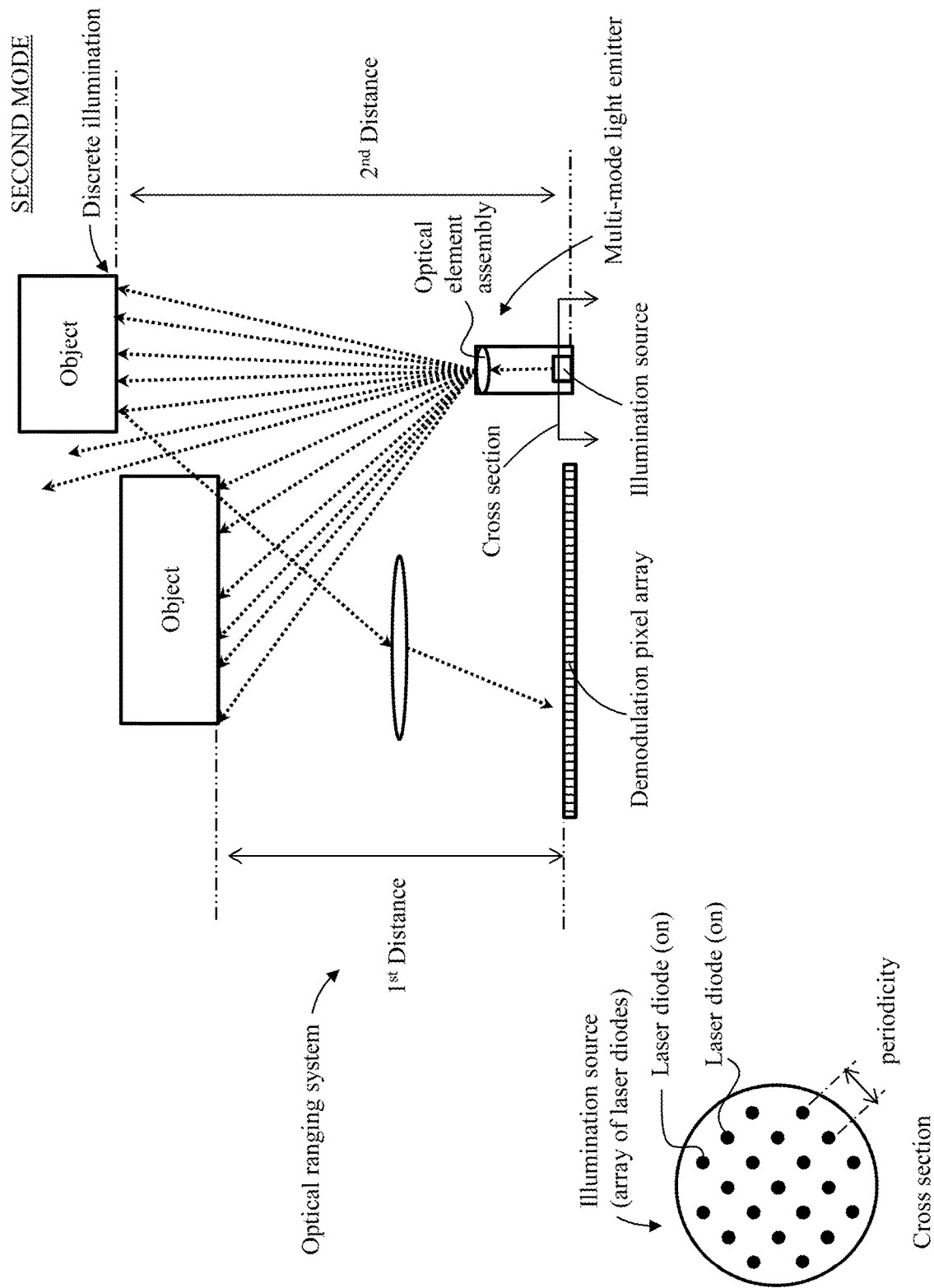

An example of an optical ranging system is illustrated in FIG. 1 and FIG. 2. Modifications of the disclosed example are within the scope of this disclosure and the appended claims.

The optical ranging system is operable to collect distance data in first and second modes as depicted in FIG. 1 and FIG. 2, respectively. The optical ranging system includes a demodulation pixel array and a multi-mode light emitter. The demodulation pixel array can include an array of pixels (e.g., photodiodes, charge-coupled devices, and/or complimentary metal-oxide semiconductor devices) operable to convert incident modulated light into a demodulated signal (e.g., as in typical time-of-flight applications) and to convert the intensity of incident light into a signal (e.g., as in typical intensity-pixel applications). The optical ranging system further includes other supporting electronics, components, and processors as would be apparent to a person of ordinary skill in the art in light of this disclosure.

The multi-mode light emitter includes an illumination source. The illumination source can be any of a number of light emitting devices such as, a laser diode, a light-emitting diode, a vertical-cavity surface-emitting laser (VCSEL), or any number of or combinations of the aforementioned light emitting devices. In some implementations, the illumination source includes an array of laser diodes as depicted in FIG. 1 and FIG. 2. In some implementations the lasers diodes are arranges periodically (i.e., having a periodic arrangement). The multi-mode light emitter is operable to generate a diffuse illumination in a first mode and a discrete illumination in a second mode. The diffuse illumination is a substantially homogenous illumination of objects in a scene (i.e., the illumination does not necessarily include discrete features). The discrete illumination includes a plurality of discrete (e.g., high-contrast) features illuminating objects in the scene. It can be an advantage to employ the diffuse illumination for a particular distance range (i.e., distance from the optical ranging system to object/objects in a scene) and to employ the discrete illumination for another particular distance range. For example, for objects that are close to the optical ranging system the diffuse illumination can be employed to capture distance data, while for objects that are far from the optical ranging system the discrete illumination can be employed to capture distance data. In some implementations, each diffuse and discrete illumination can consume the same amount of power. Consequently, significant power savings can be achieved in some implementations.

In some implementations, the multi-mode light emitter can include an optical element assembly. The optical element assembly can include any number or combinations of refractive and diffractive elements. In addition, the optical element assembly can be operable to produce the diffuse illumination corresponding to the first mode and the discrete illumination corresponding to the second mode. In some implementations the optical element assembly can further include a tunable optical element and/or an actuatable optical element. The tunable and/or actuatable optical elements can be operable to generate the diffuse illumination in the first mode and the discrete illumination in the second mode. For example, in some implementations an optical surface profile of the tunable optical element can be altered by the application of electrical power such that an optical surface profile in a first mode generates the diffuse illumination and another optical surface profile in a second mode generates the discrete illumination. In other implementations a refractive index of the tunable optical element can be altered with the application of electrical power such that a refractive index in a first mode generates the diffuse illuminant and another refractive index in a second mode generates the discrete illumination. Still in other implementations, the actuatable optical element can include components for actuating the actuatable optical element (e.g., piezoelectric, voice-coil, induction, or electromagnetic components). In some implementations the actuatable optical element can be operable to actuate along the optical axis of the system such that an illumination generated by the multi-mode light emitter would be diffuse in a first mode and discrete in a second mode (i.e., when the actuatable optical element is actuated to a new position along the optical axis).

In some implementations, the optical ranging system can include the array of laser diodes operable to produce the diffuse illumination in the first mode and the discrete illumination corresponding to the second mode. For example, the array of laser diodes having a period arrangement of laser diodes can be operated such that in the first mode only select laser diodes can be configured to generate light such that the periodicity of the array of laser diodes is disrupted, wherein a diffuse illumination is generated. Further, in a second mode, the laser diodes can be configured to generate light such that the periodicity of the array of laser diodes is not disrupted, where a discrete illumination is generated.

In some implementations, distance data can be collected by a time-of-flight technique in the first mode (i.e., when an objects/objects in a scene are illuminated by the diffuse illumination). Further, in such implementations, distance data is collected by a structured-light technique in the second mode (i.e., when an object/objects in a scene are illuminated by the discrete illumination).

Various modifications and combinations of features will be evident from the foregoing examples and are within the spirit of the invention. Accordingly, other implementations are within the scope of the claims.

What is claimed is:

1. An optical ranging system operable to collect distance data, the system comprising:
   a demodulation pixel array and a multi-mode light emitter;
   the multi-mode light emitter having an illumination source; and
   the multi-mode light emitter being operable to generate a diffuse illumination in a first mode and a discrete illumination in a second mode, wherein the diffuse illumination provides a substantially homogenous illumination and wherein the discrete illumination includes a plurality of high-contrast features.

2. The optical ranging system of claim 1, wherein the optical ranging system is operable to collect distance data within a first distance range using the first mode, and is further operable to collect distance data within a second distance range using the second mode.

3. The optical ranging system of claim 1, wherein the illumination source includes a laser diode.

4. The optical ranging system of claim 3, wherein the illumination source includes an array of laser diodes.

5. The optical ranging system of claim 1, the multi-mode light emitter further comprising an optical element assembly.

6. The optical ranging system of claim 5, wherein the optical element assembly is operable to produce the diffuse illumination corresponding to the first mode and the discrete illumination corresponding to the second mode.

7. The optical ranging system of claim 4, wherein the array of laser diodes is operable to produce the diffuse illumination corresponding to the first mode and the discrete illumination corresponding to the second mode.

8. The optical ranging system of claim 2, wherein power consumption of the first and second modes is substantially similar.

9. The optical ranging system of claim 5, wherein the optical element assembly comprises a tunable optical element.

10. The optical ranging system of claim 2, operable such that distance data is collected by a time-of-flight technique in the first mode, and distance data is collected by a structured-light technique in the second mode.

11. The optical ranging system of claim 5, wherein the optical element assembly comprises an actuatable optical element operable to generate the diffuse illumination in the first mode and the discrete illumination in the second mode.

12. The optical ranging system of claim 4, wherein the laser diodes within the array of laser diodes have a periodic arrangement.

13. The optical ranging system of claim 12, wherein the array of laser diodes having the periodic arrangement are operable to produce the discrete illumination in the second mode, and the array of laser diodes having the periodic arrangement are operable to disrupt the periodic arrangement to produce the diffuse illumination in the first mode.

14. The optical ranging system of claim 9, wherein an optical surface profile of the tunable optical element is altered by the application of electrical power.

15. The optical ranging system of claim 9, wherein a refractive index of the tunable optical element is altered by the application of electrical power.

* * * * *